(12) United States Patent
Qin

(10) Patent No.: US 10,494,714 B2
(45) Date of Patent: Dec. 3, 2019

(54) CHUCK FOR CHEMICAL VAPOR DEPOSITION SYSTEMS AND RELATED METHODS THEREFOR

(75) Inventor: Wenjun Qin, Missoula, MT (US)

(73) Assignee: OCI COMPANY LTD., Seoul (KR)

(*) Notice: Subject to any disclaimer, the term of this patent is extended or adjusted under 35 U.S.C. 154(b) by 718 days.

(21) Appl. No.: 12/983,571

(22) Filed: Jan. 3, 2011

(65) Prior Publication Data

US 2012/0171845 A1 Jul. 5, 2012

(51) Int. Cl.
| | | |
|---|---|---|
| H01L 21/20 | (2006.01) | |
| C23C 16/50 | (2006.01) | |
| C23C 16/44 | (2006.01) | |
| C01B 33/035 | (2006.01) | |

(52) U.S. Cl.
CPC ........ C23C 16/4418 (2013.01); C01B 33/035 (2013.01)

(58) Field of Classification Search
CPC .............................. C01B 33/035; C23C 16/24
USPC ........ 118/715, 722, 723 R, 728; 156/345.51; 117/200–224
See application file for complete search history.

(56) References Cited

U.S. PATENT DOCUMENTS

| | | | |
|---|---|---|---|
| 3,286,685 A * | 11/1966 | Ulrich | C01B 33/035 118/729 |
| 3,447,902 A | 6/1969 | Benedict et al. | |
| 3,746,496 A * | 7/1973 | Dietze | C23C 16/01 118/733 |
| 4,147,814 A | 4/1979 | Yatsurugi et al. | |
| 4,150,168 A * | 4/1979 | Yatsurugi et al. | 427/588 |
| 4,423,881 A * | 1/1984 | Whitehead | 279/62 |
| 4,721,423 A | 1/1988 | Kubo | |
| 5,277,934 A | 1/1994 | Gilbert et al. | |
| 5,284,640 A | 2/1994 | Jernegan et al. | |
| 5,443,275 A | 8/1995 | Knobl et al. | |
| 6,042,644 A * | 3/2000 | Kurosaka et al. | 117/13 |
| 6,284,312 B1 | 9/2001 | Chandra et al. | |
| 6,365,225 B1 | 4/2002 | Chandra et al. | |
| 8,703,248 B2 | 4/2014 | Endoh et al. | |
| 2009/0238992 A1* | 9/2009 | Endoh et al. | 427/543 |
| 2010/0058988 A1* | 3/2010 | Endoh | C01B 33/035 118/725 |
| 2011/0226628 A1 | 9/2011 | Kraus | |

(Continued)

FOREIGN PATENT DOCUMENTS

| | | |
|---|---|---|
| CN | 201372204 Y | 12/2009 |
| CN | 101724892 A | 6/2010 |
| CN | 201626835 U | 11/2010 |

(Continued)

OTHER PUBLICATIONS

English Machine Translation of WIPO 2010133386. Performed and printed on Dec. 13, 2013 from https://www.google.com/patents/WO2010133386A1?cl=en&dq=wo2010/133386&hl=en&sa=X&ei=Q5WoUqaECoe0kAfF5IDQCw&ved=0CDAQ6AEwAQ.*
English Machine Translation of DE102010003069A1 to Kraus, obtained from http://translationportal.epo.org/ on Dec. 27, 2016.*

(Continued)

*Primary Examiner* — Karla A Moore
*Assistant Examiner* — Tiffany Z Nuckols
(74) *Attorney, Agent, or Firm* — McDonnell Boehnen Hulbert & Berghoff LLP

(57) ABSTRACT

The present invention provides chucks having a well that supports rods produced during chemical vapor deposition. The chucks can utilize slats and windows around the well up to which the rod can grow and become supported.

9 Claims, 7 Drawing Sheets

(56) References Cited

U.S. PATENT DOCUMENTS

2012/0135635 A1* 5/2012 Stubhan et al. .............. 439/533

FOREIGN PATENT DOCUMENTS

| DE | 102009015196 A1 | 10/2010 | |
|----|----|----|----|
| DE | 102010003069 A1 * | 9/2011 | ........... C01B 33/035 |
| EP | 0 529 593 A1 | 3/1993 | |
| JP | 2011-195438 A | 10/2011 | |
| KR | 10-2007-0069563 | 7/2007 | |
| KR | 10-2010-0094039 | 8/2010 | |
| WO | 2010/008477 A2 | 1/2010 | |
| WO | WO 2010115542 A1 * | 10/2010 | |
| WO | WO 2010133386 A1 * | 11/2010 | |

OTHER PUBLICATIONS

SGL Carbon GmbH, "DIABON—Graphite for Engineered Process Equipment—Process Technology," 20 pages, 2008.
International Search Report and Written Opinion of the International Searching Authority dated Sep. 27, 2012 for International Application No. PCT/US2011/067178.
Chinese First Office Action dated Nov. 24, 2014 for Application No. 201180063930.6 (with translation).
Office Action dated Aug. 18, 2015 for Taiwan Application No. 101100200.
Official Action dated Jul. 23, 2015 for Japanese Application No. 2013-547594 (English translation provided).
Chinese Second Office Action dated Aug. 7, 2015 for Application No. 201180063930.6 (with translation).
European Search Report dated Oct. 19, 2015 for Application No. EP11854887.4.

* cited by examiner

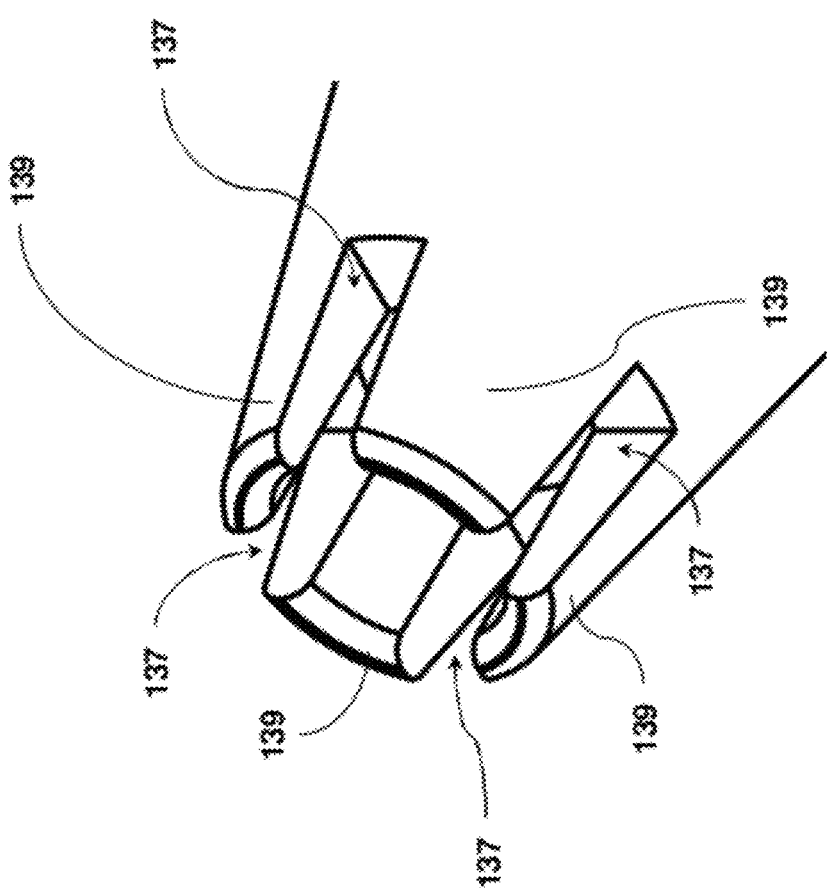

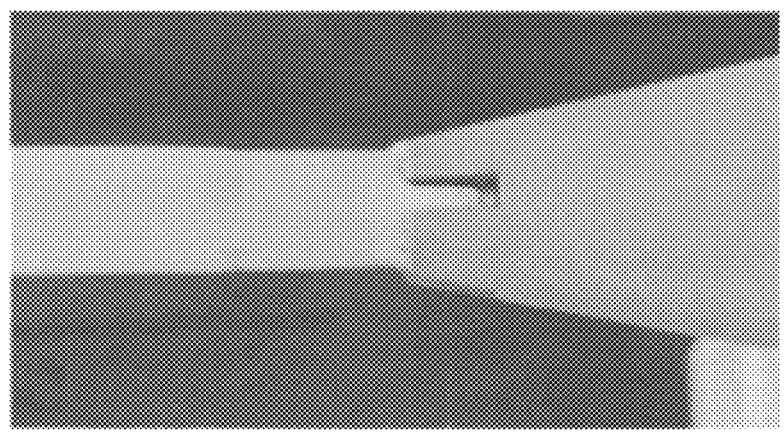
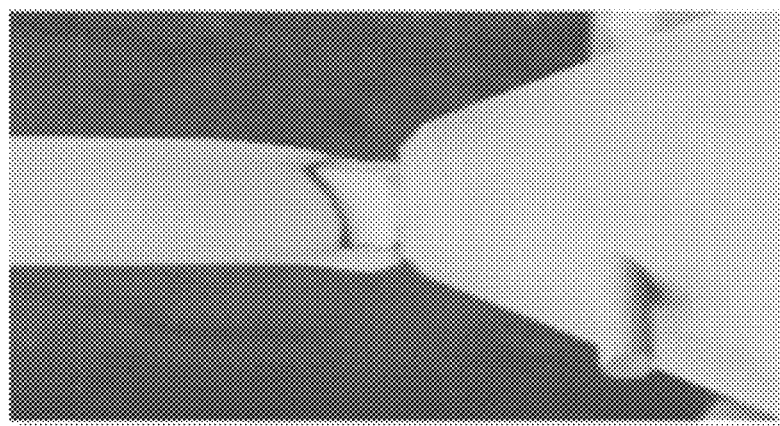
FIG. 7A
FIG. 7B

CHUCK FOR CHEMICAL VAPOR DEPOSITION SYSTEMS AND RELATED METHODS THEREFOR

BACKGROUND OF INVENTION

1. Field of Invention

This invention is directed to chemical vapor deposition (CVD) systems utilized to produce semiconductor materials, which can be utilized as components in photovoltaic systems. More particularly, this invention can pertain to improved chucks as well as to systems and methods incorporating improved chucks in chemical vapor deposition processes.

2. Discussion of Related Art

Yatsurugi et al., in U.S. Pat. No. 4,147,814, disclosed a method of manufacturing high-purity silicon rods having a uniform section shape.

Gilbert et al., in U.S. Pat. No. 5,277,934, disclosed a method for protecting a graphite chuck for a starter filament in the manufacture of polycrystalline silicon.

Chandra et al., in U.S. Pat. No. 6,284,312 B1, described a method and apparatus for chemical vapor deposition of polysilicon, and which is incorporated herein by reference in its entirety for all purposes.

Gum et al., in International Publication No. WO 2010/0008477, disclosed a chuck and bridge connection points for tube filaments in a chemical vapor deposition reactor.

SUMMARY OF THE INVENTION

One or more aspects of the invention can pertain to a chuck which can be utilized in chemical vapor deposition systems. The chuck can have a first section comprising a well and a filament channel. The chuck typically also has a second section having an electrode channel. In some configurations of the invention, the well can be defined by a plurality of slats extending circumferentially from a bottom surface of the well to an end of the first section. Each of the plurality of slats can be separated by a window, and in some further configurations of the invention, each window can extend, at least partially, along a length of an adjacent slat. In some configurations of the invention, the chuck can have a circular cylindrical body. In further configurations of the invention, the well can be concentrically disposed within the body and, in some cases, is at least partially defined by a wall circumferentially surrounding the well. In one or more configurations of the invention, the chuck can comprise a plurality of slots disposed circumferentially around the well. Each of the plurality of slots can be configured to extend substantially along a length of the well. In further configurations of the invention, the well, the filament channel, and the electrode channel can be concentrically disposed along a longitudinal axis of the chuck.

One or more aspects of the invention can be directed to a chemical vapor deposition system. The chemical vapor deposition apparatus can comprise a chuck having a frustoconical section and a first contacting section, the frustoconical section having a filament channel and concentrically surrounding a cylindrically-shaped well, and a filament having an end secured in the filament channel. The cylindrically-shaped well typically has a well diameter that is greater than a filament diameter of the filament channel. The chemical vapor deposition system can further comprise a second chuck which, in some configurations of the invention, can have a second filament channel and a second frustoconical section that circumferentially surrounds a second well. The filament can have a second end thereof secured in the second filament channel. In some configurations of the invention, the filament is electrically connected to an electrical current source through the first contacting section and a second contacting section of the second chuck. Any one or both of the first frustoconical section and the second frustoconical section can have a plurality of windows fluidly connecting an interior volume of the well to an exterior environment of the first chuck or the second chuck, respectively. Each of the plurality of windows can extend substantially along at least a portion of the well and can be parallel to a longitudinal axis of the frustoconical section.

One or more aspects of the invention can be directed to a method of producing a semiconductor rod. The method of producing a semiconductor rod can comprise securing a first chuck in a vapor deposition reactor, the first chuck having a first filament channel and a first frustoconical section concentrically surrounding a first cylindrically-shaped well, securing a second chuck in the vapor deposition reactor, the second chuck having a second filament channel and a second frustoconical section concentrically surrounding a second cylindrically-shaped well, securing a first end of a filament in the first filament channel and securing a second end of the filament in the second filament channel, introducing at least one semiconductor precursor compound in the vapor deposition reactor, and passing an electric current through the filament to heat the filament to a reaction temperature thereby promoting conversion of at least a portion of the at least one semiconductor precursor compound into the semiconductor on the heated filament. In some variants of the method in accordance with the invention, the first chuck can have a plurality of windows disposed around the cylindrically-shaped well.

BRIEF DESCRIPTION OF THE DRAWINGS

The accompanying drawings are not drawn to scale. In the drawings, each identical or nearly identical component that is illustrated in the various figures is represented by a like numeral. For purposes of clarity, not every component may be labeled in every drawing.

In the drawings:

FIG. 5 is a schematic illustration showing a perspective view of an end of a first section of the chuck schematically shown in FIG. 3, in accordance with one or more embodiments of the invention;

FIG. 7A shows a conventional, prior art chuck utilized to produce polycrystalline silicon semiconductor material; and FIG. 7B shows a chuck utilized to produce polycrystalline silicon semiconductor material, in accordance with one or more aspects of the invention.

DETAILED DESCRIPTION

One or more aspects of the invention involve utilizing chucks in chemical vapor deposition system that reduce or even eliminate the likelihood of tip-over events that can occur under some deposition conditions. The present invention can provide a chuck having a well that supports rods produced during the chemical vapor deposition process. The chuck can have windows and slats around the well, up to which the rod can grow and become supported. Some aspects of the invention thus provide features directed against or to reduce a likelihood of tip-over of a rod produced in a CVD reactor to avoid a ground fault that renders other produced and otherwise suitable rods to be incompletely grown. Further aspects of the invention can involve utilizing a chuck during chemical vapor deposition processes that have features that provide a thermal barrier around a filament upon which a product is deposited.

Figure 1:
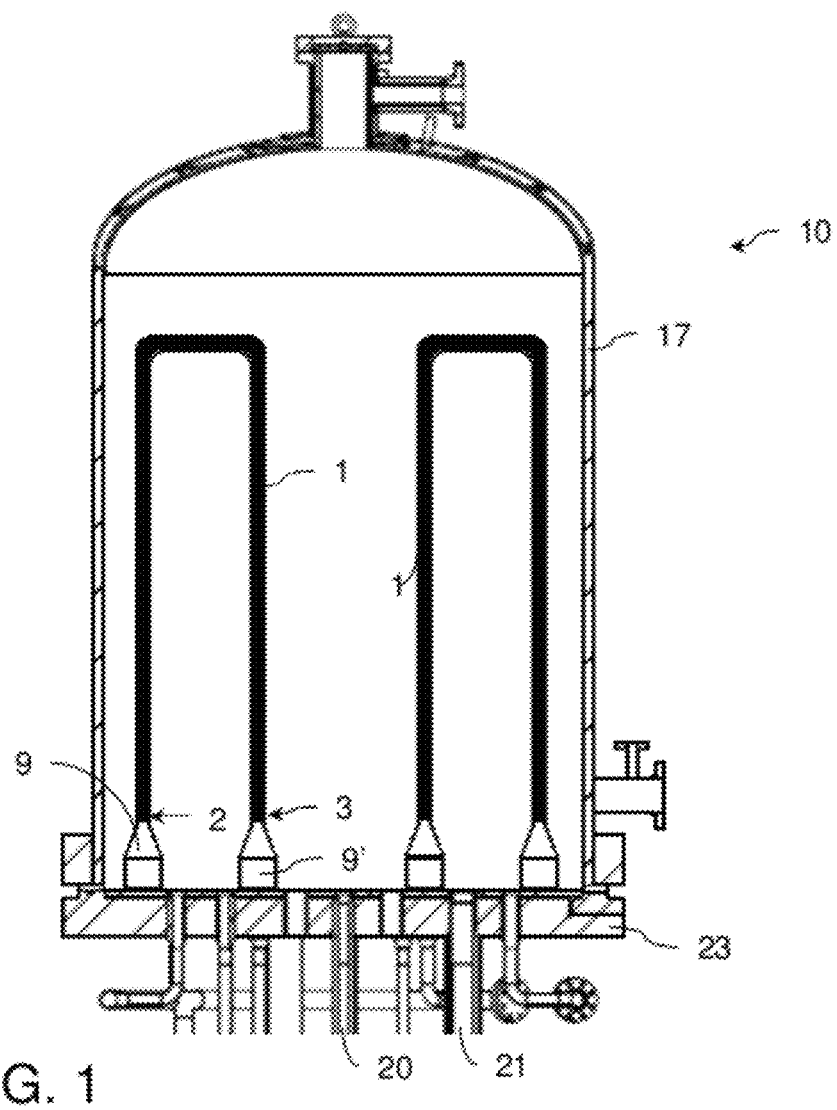
FIG. 1 is a schematic illustration showing a cross-section of a portion of a chemical vapor deposition system that may be utilized to implement one or more aspects of the invention.
Figure 2:
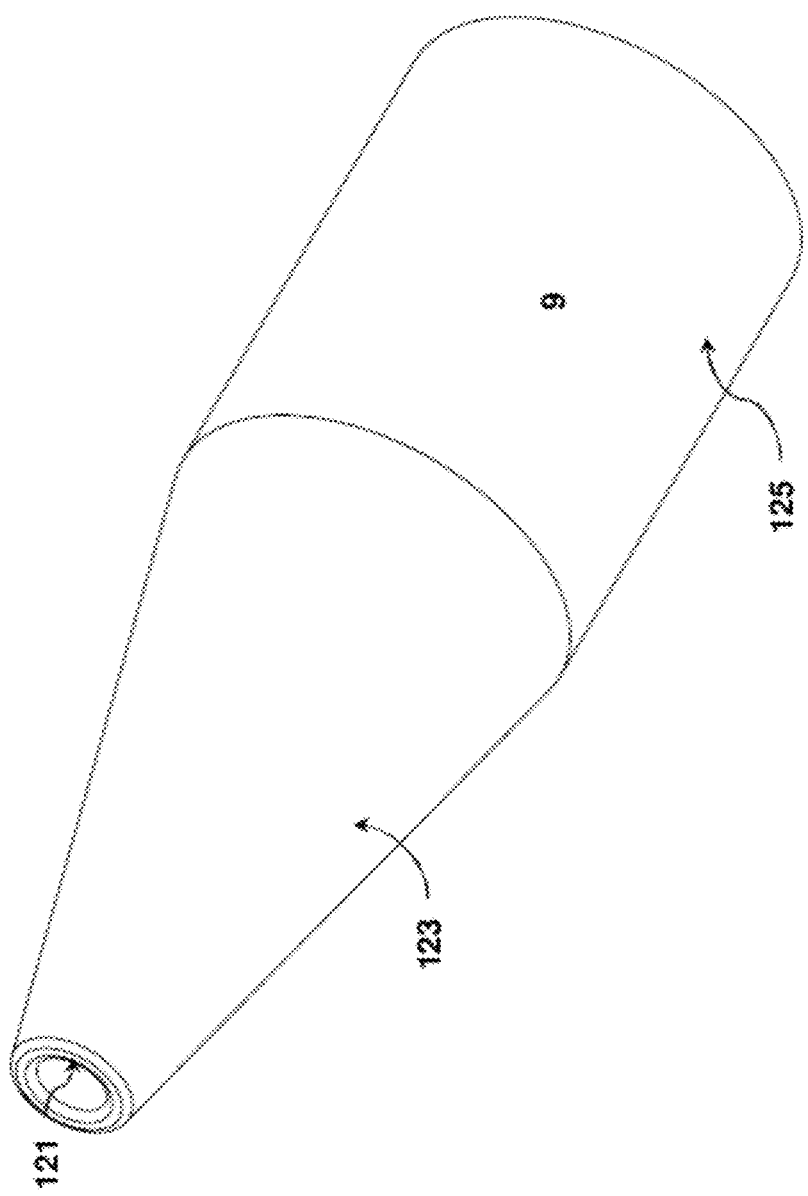
FIG. 2 is a schematic illustration showing perspective view of a chuck, in accordance with one or more embodiments of the invention.
Figure 3:
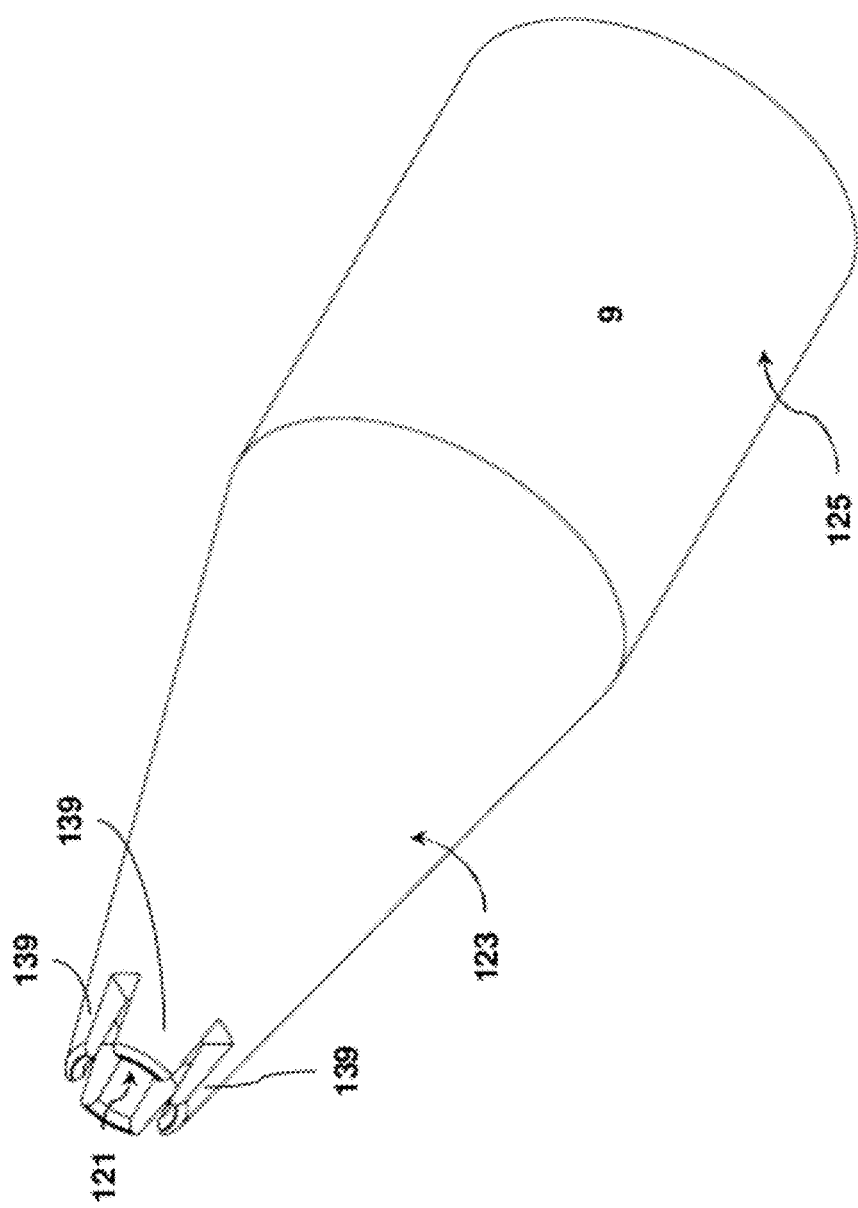
FIG. 3 is a schematic illustration showing perspective view of a chuck, in accordance with one or more further embodiments of the invention.

FIG. 1 shows a cross-sectional view of a CVD system 10 capable of being used in accordance with one or more aspects of the invention. System 10 can have a base plate 23 and a bell jar 17. System 10 can further have one or more gas inlets 20 and one or more gas outlets 21. Electrodes are typically incorporated in base plate 23. One or more viewing ports (not shown) may be utilized to allow visual inspection of the interior of system 10. System 10 typically utilizes at least one filament 1 upon which the produced semiconductor material is deposited.

One or more aspects of the invention involve one or more chucks 9 and 9' that provide mechanical support to vertically oriented filament 1 and deposited material thereon as well as electrical connectivity to the electrode. As exemplarily illustrated in FIGS. 2-5, the chuck 9 can have a well 121 at a first section 123 thereof. Chuck 9 can also have a second section 125 proximate or contiguous with first section 123. Second section 125 of chuck 9 can be a contacting section which typically has an electrode channel 127. Further configurations of chuck 9 further involve a filament channel 129, typically disposed within first section 123. As exemplarily illustrated, chuck 9 can be substantially cylindrically-shaped, such as circular cylindrical, with a frustoconical first section 123 and a circular cylindrical second section 125. Further exemplary configurations involve radially symmetrical chucks having each of well 121, filament channel 129, and electrode channel 127 concentrically disposed and aligned along a longitudinal axis 131 of chuck 9. As also exemplarily illustrated, filament channel 129 can have an opening 133 at a bottom surface 135 of well 121. In embodiments wherein the well has a circularly-shaped cross-section and the filament channel has a circularly-shaped cross-section, the diameter of the well is typically greater than the diameter of the filament channel. The chuck can have a circular cylindrical body wherein the well is concentrically disposed within the body. In some cases, the well can be at least partially defined by a wall circumferentially surrounding the well.

Figure 4:
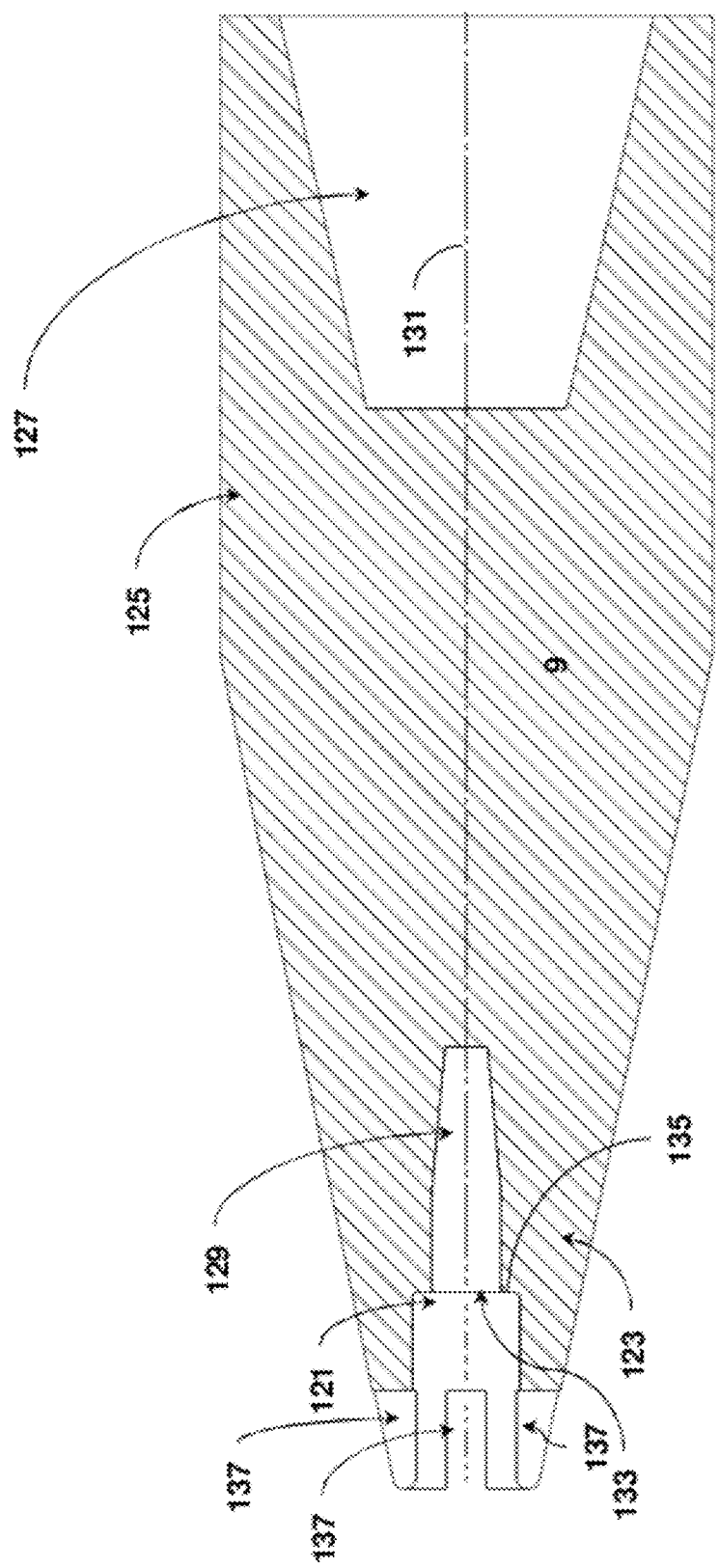
FIG. 4 is a schematic illustration showing a longitudinal cross-section of the chuck schematically shown in FIG. 3, in accordance with one or more embodiments of the invention.

Particular configurations of the invention can involve chucks having one or more windows or slots 137 and one or more slats 139, as exemplarily shown in FIGS. 4 and 5. Slats 139 can be disposed to circumferentially surround and at least partially define well 121. One or more windows or slots 137 can be sized and configured to separate a first slat from another slat. Also, one or more of windows or slots 137 can be sized and configured to be partly or substantially along a length of well 121, such as from bottom surface 135 of well 121 to an open end or tip of chuck 9. FIG. 4 shows an example in which slots 137 have a length that is approximately half of the length or depth of well 121. Further configurations of the invention can involve utilizing a plurality of windows or slots 137 circumferentially surrounding an interior volume of well 121. The chuck can have any number of slats and can have any number of slots. Preferred embodiments typically involve utilizing equispatially arranged slats that circumferentially surround well 121. Equispatially arranged slots can also be utilized, such as is shown in FIG. 5. Further, any geometrical configuration of any one or more window can be utilized. Preferred embodiments are typically directed to slots having a uniform configuration, such as the exemplarily illustrated rectangular geometry.

Filament channel 129 is typically configured and sized to receive an end of filament 1. Filament channel 129 can have a cross-sectional geometry that corresponds with a cross-sectional configuration of an end of filament 1. Further embodiments can involve a filament channel with a tapered region that is sized to provide an interference fit with an end of the filament. Thus, for example, as shown in FIG. 1, first end 2 of filament 1 is typically secured in filament channel 129 of chuck 9 and a second end 3 of filament 1 is typically secured to a second chuck 9' at a corresponding filament channel thereof.

In typical service, filament 1 is electrically connected to one or more electrical power sources (not shown) through chucks 9 and 9' and respective electrodes through respective electrode channels 127. System 10 is typically fluidly connected to one or more sources of one or more precursor compounds through one or more inlets 20. An electrical current is passed through the one or more filaments 1 which generates heat and raises the temperature thereof to a desired reaction temperature, which can be a temperature or a temperature range that favors semiconductor material production, such as polycrystalline silicon deposition. Unreacted precursor compounds and byproduct compounds can be removed from the reaction volume enclosed within jar 17 and base plate 23 through one or more outlet ports 21. The chemical vapor deposition process can be performed until a desired amount of semiconductor material has been grown or produced as semiconductor rods.

The chucks of the invention can be comprised of a carbon such as graphite, silicon or other suitable materials. Preferably, chucks in accordance with some aspects of the invention can be fabricated from carbon containing compounds. For example, pitch can be converted by heating at a temperature of about 1,200° C. to amorphous carbon. The density of the amorphous carbon intermediate can be increased by rebaking and compaction. The amorphous carbon body can then be graphitized at a temperature or a range of temperatures that promotes crystallographic orientation, such as at a temperature of about 3,000° C. The graphitized body can be machined to include a well and one or more windows as well as other features and to desired dimensions.

The function and advantages of these and other embodiments of the invention can be further understood from the examples below, which illustrate the benefits and/or advantages of the one or more systems and techniques of the invention but do not exemplify the full scope of the invention.

Example 1

Figure 6B:
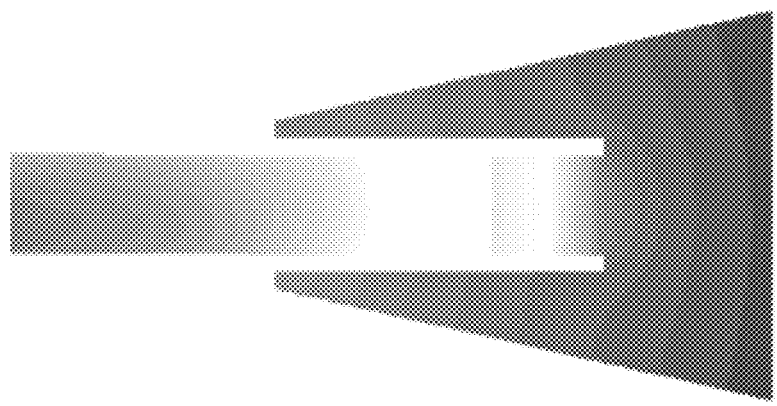
FIG. 6B shows the temperature profile of a chuck utilized to produce polycrystalline silicon semiconductor material, in accordance with one or more aspects of the invention.
Figure 6A:
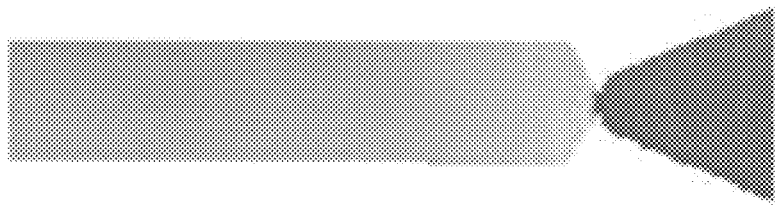
FIG. 6A shows the temperature profile of a conventional, prior art chuck utilized to produce polycrystalline silicon semiconductor material.

This example presents the results of a characterization study of the chuck in accordance with the invention compared to a conventional chuck in producing polycrystalline silicon. In the example, filaments with a diameter of about 6 mm were evaluated in a CVD system having a single center injection nozzle, at various flow rates ranging from about 20 Kg/hr to about 180 Kg/hr, and injection rates ranging from about 17 m/s to about 152 m/s. The surface temperature of the rods was set at about 1,150° C. FIG. 6A shows the temperature profile of a conventional chuck and FIG. 6B shows the temperature profile of a chuck having a well in accordance with the invention. As can be seen, the filament in FIG. 6B was expected to have a temperature gradient along a longitudinal axis but the region proximate the end of the well was expected to be at or above the deposition temperature, which promotes deposition and growth into the chuck that would support the produced rod. In contrast, the conventional chuck lacked any features that would support the produced rod during growth, which is susceptible to buckling or lateral displacement by forces directed at the rod surface, such as from fluid flow paths.

Example 2

This presents the results of another study of the chuck in accordance with the present invention, compared to a conventional chuck. In this example, six filaments each with a diameter of about 7 mm were used in a CVD system that included chucks as exemplarily illustrated in FIG. 3 to produce six rods of polycrystalline silicon. Conventional chucks, without a well, were also included. The CVD system had a single center injection nozzle and reactants were introduced at a rate of about 12 Kg/hr. Each of the filaments/rods was electrically heated to about 1,050° C.

As shown in FIGS. 7A and 7B, rod formation utilizing a conventional chuck (FIG. 7A) can result in polycrystalline silicon rods that are unsupported at the end regions thereof whereas utilizing a chuck in accordance with aspects of the invention can produce supported polycrystalline silicon rods (FIG. 7B).

Having now described some illustrative embodiments of the invention, it should be apparent to those skilled in the art that the foregoing is merely illustrative and not limiting, having been presented by way of example only. Numerous modifications and other embodiments are within the scope of one of ordinary skill in the art and are contemplated as falling within the scope of the invention. In particular, although many of the examples presented herein involve specific combinations of method acts or system elements, it should be understood that those acts and those elements may be combined in other ways to accomplish the same objectives.

Those skilled in the art should appreciate that the parameters and configurations described herein are exemplary and that actual parameters and/or configurations will depend on the specific application in which the systems and techniques of the invention are used. Those skilled in the art should also recognize or be able to ascertain, using no more than routine experimentation, equivalents to the specific embodiments of the invention. It is therefore to be understood that the embodiments described herein are presented by way of example only and that, within the scope of the appended claims and equivalents thereto; the invention may be practiced otherwise than as specifically described.

Moreover, it should also be appreciated that the invention is directed to each feature, system, subsystem, or technique described herein and any combination of two or more features, systems, subsystems, or techniques described herein and any combination of two or more features, systems, subsystems, and/or methods, if such features, systems, subsystems, and techniques are not mutually inconsistent, is considered to be within the scope of the invention as embodied in the claims. Further, acts, elements, and features discussed only in connection with one embodiment are not intended to be excluded from a similar role in other embodiments.

As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

What is claimed is:

1. A chemical vapor deposition system, comprising:
   a chuck configured to provide mechanical support to a vertically oriented filament, comprising:
   a body having a first section comprising a well extending downwardly within the body, the well including a first end and a second end, the well including only one opening extending further downwardly within the body, the opening comprising a filament channel sized and configured to receive an end of the filament, wherein a diameter of the well is larger than a diameter of the filament channel, and wherein a bottom surface of the well is substantially flat and directly connected to the opening of the filament channel;
   a plurality of slots disposed circumferentially around the well, each of the plurality of slots extending substantially along a length of the well;
   and a second section proximate the first section, the second section having a coaxially disposed electrode channel; and an electrode in communication with the electrode channel;
   and wherein the well of the chuck is defined by a plurality of slats extended circumferentially from the bottom surface of the well to an end of the first section.

2. The chemical vapor deposition system of claim 1, wherein each of the plurality of slats of the chuck is separated by a window, each window extending at least partially along a length of an adjacent slat.

3. The chemical vapor deposition system of claim 1, the chuck having a circular cylindrical body, and wherein the well is concentrically disposed within the body and is at least partially defined by a wall circumferentially surrounding the well.

4. The chemical vapor deposition system of claim 1, wherein the well, the filament channel, and the electrode channel are concentrically disposed along a longitudinal axis of the chuck.

5. A chemical vapor deposition system, comprising:
   a chuck configured to mechanically support a filament, the chuck having a body including an outer frustoconical section proximate a contacting section, the outer frustoconical section having a filament channel sized and configured to receive an end of the filament, the outer frustoconical section concentrically surrounding a well disposed above the filament channel, the well having a diameter larger than a diameter of the filament channel, and the contacting section having an electrode channel, and each of the well, filament channel, and electrode channel concentrically disposed and aligned along a longitudinal axis;

wherein the chuck further comprises a plurality of slots disposed circumferentially around the well, each of the plurality of slots extending substantially along a length of the well;

a filament having an end secured in the filament channel, and an electrode in communication with the electrode channel, wherein the well includes a first end and a second end, and wherein a bottom surface of the well is substantially flat;

wherein the well of the chuck is defined by a plurality of slats extended circumferentially from the bottom surface of the well.

6. The chemical vapor deposition system of claim 5, further comprising a second chuck, the second chuck having a contacting section, a filament channel, and an outer frustoconical section circumferentially surrounding a well, wherein the filament has a second end secured in the filament channel of the second chuck.

7. The chemical vapor deposition system of claim 6, wherein the filament is electrically connected to an electrical current source through the contacting sections of the first and second chucks.

8. The chemical vapor deposition system of claim 5, wherein the outer frustoconical section of the chuck has a plurality of windows fluidly connecting an interior volume of the well to an exterior environment of the chuck.

9. The chemical vapor deposition system of claim 8, wherein each of the plurality of windows of the chuck extend substantially along at least a portion of the well parallel to a longitudinal axis of the outer frustoconical section.

* * * * *